(12) United States Patent
Takobe (10) Patent No.: US 12,425,020 B2
(45) Date of Patent: Sep. 23, 2025

(54) SWITCH CIRCUIT, SWITCHED CAPACITOR CONVERTER, AND VEHICLE

(71) Applicant: ROHM Co., LTD., Kyoto (JP)

(72) Inventor: Isao Takobe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 62 days.

(21) Appl. No.: 18/314,409

(22) Filed: May 9, 2023

(65) Prior Publication Data

US 2023/0370063 A1 Nov. 16, 2023

(30) Foreign Application Priority Data

May 11, 2022 (JP) ................................. 2022-078104

(51) Int. Cl.
| | |
|---|---|
| H03K 17/08 | (2006.01) |
| B60L 3/00 | (2019.01) |
| H02M 3/07 | (2006.01) |
| H03K 17/687 | (2006.01) |
| H03K 19/003 | (2006.01) |

(52) U.S. Cl.
CPC .......... *H03K 17/687* (2013.01); *B60L 3/0084* (2013.01); *H02M 3/07* (2013.01); *H03K 17/08* (2013.01); *H03K 19/00315* (2013.01)

(58) Field of Classification Search
None
See application file for complete search history.

(56) References Cited

U.S. PATENT DOCUMENTS

| | | | | | |
|---|---|---|---|---|---|
| 4,918,336 | A | * | 4/1990 | Graham | H03K 19/0952 326/31 |
| 5,923,513 | A | * | 7/1999 | Pelly | H03K 17/08148 361/90 |
| 6,194,920 | B1 | * | 2/2001 | Oguri | H03F 3/4521 327/563 |
| 9,013,848 | B2 | * | 4/2015 | Lui | H03K 17/0822 361/91.5 |
| 9,268,351 | B2 | * | 2/2016 | Rutter | H03K 17/08148 |
| 9,998,000 | B2 | * | 6/2018 | Zhang | H02M 3/07 |
| 10,177,643 | B2 | * | 1/2019 | Davidson | H02M 5/45 |
| 10,468,978 | B2 | * | 11/2019 | Zhang | H02M 3/073 |
| 10,541,622 | B2 | * | 1/2020 | Onda | H02P 27/06 |
| 10,585,447 | B1 | * | 3/2020 | Tanimoto | G05F 3/262 |
| 10,992,123 | B2 | * | 4/2021 | Mourrier | H02H 3/025 |
| 11,184,000 | B2 | * | 11/2021 | Kim | G01R 1/06766 |
| 11,277,129 | B2 | * | 3/2022 | Thomsen | H10N 30/802 |
| 11,293,992 | B2 | * | 4/2022 | Ashourloo | G01R 31/56 |
| 2023/0361672 | A1 | * | 11/2023 | Takobe | H02M 3/158 |
| 2023/0361673 | A1 | * | 11/2023 | Takobe | H02M 1/088 |

FOREIGN PATENT DOCUMENTS

JP 2006-54955 2/2006

* cited by examiner

*Primary Examiner* — Thomas J. Hiltunen
(74) *Attorney, Agent, or Firm* — CHIP LAW GROUP (57) ABSTRACT

Disclosed is a switch circuit including a switch unit including at least one switching element, and a balance circuit provided for the switch unit, the balance circuit being configured to inhibit a potential difference across the switch unit from exceeding a threshold value.

9 Claims, 7 Drawing Sheets

SWITCH CIRCUIT, SWITCHED CAPACITOR CONVERTER, AND VEHICLE

CROSS REFERENCE TO RELATED APPLICATIONS

This U.S. application claims priority benefit of Japanese Patent Application No. JP 2022-078104 filed in the Japan Patent Office on May 11, 2022. Each of the above-referenced applications is hereby incorporated herein by reference in its entirety.

BACKGROUND

The disclosure described in the present specification relates to a switch circuit, a switched capacitor converter, and a vehicle.

In the related art, a switched capacitor converter is used as a power supply (see Japanese Patent Laid-open No. 2006-54955, for example).

The switched capacitor converter has a configuration that includes a plurality of connection nodes between switching elements and in which capacitors are appropriately connected to and between the connection nodes. The switched capacitor converter generates an output voltage by subjecting an input voltage to direct current/direct current (DC/DC) conversion.

In a switched capacitor converter in which the input voltage is higher than the output voltage, there is a connection node at which a switching voltage lower than the input voltage occurs, and thus, a switching element having a withstand voltage lower than the input voltage can be used. Meanwhile, in a switched capacitor converter in which the output voltage is higher than the input voltage, there is a connection node at which a switching voltage lower than the output voltage occurs, and thus, a switching element having a withstand voltage lower than the output voltage can be used.

DETAILED DESCRIPTION

In the present specification, a metal oxide semiconductor (MOS) field-effect transistor refers to a field-effect transistor in which a gate structure includes at least the following three layers: a "layer including a conductor or a semiconductor such as polysilicon having a small resistance value," an "insulating layer," and a "P-type, N-type, or intrinsic semiconductor layer." That is, the gate structure of the MOS field-effect transistor is not limited to a three-layer structure of metal, an oxide, and a semiconductor.

In the present specification, a reference voltage refers to a fixed voltage in an ideal state. In practice, the reference voltage is a voltage that can slightly vary according to a temperature change or other factors.

In the present specification, a constant current refers to a fixed current in an ideal state. In practice, the constant current is a current that can slightly vary according to a temperature change or other factors.

Switched Capacitor Converter (Comparative Example)

Figure 1:
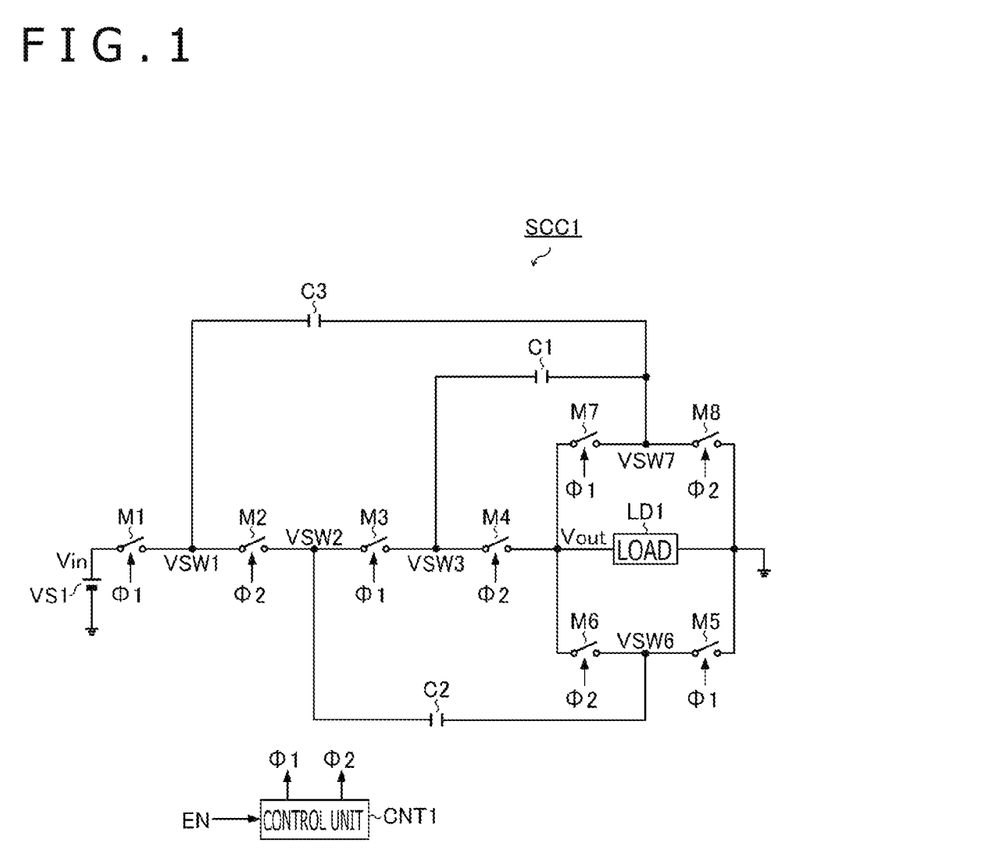
FIG. 1 is a diagram illustrating a comparative example of a switched capacitor converter.
Figure 2:
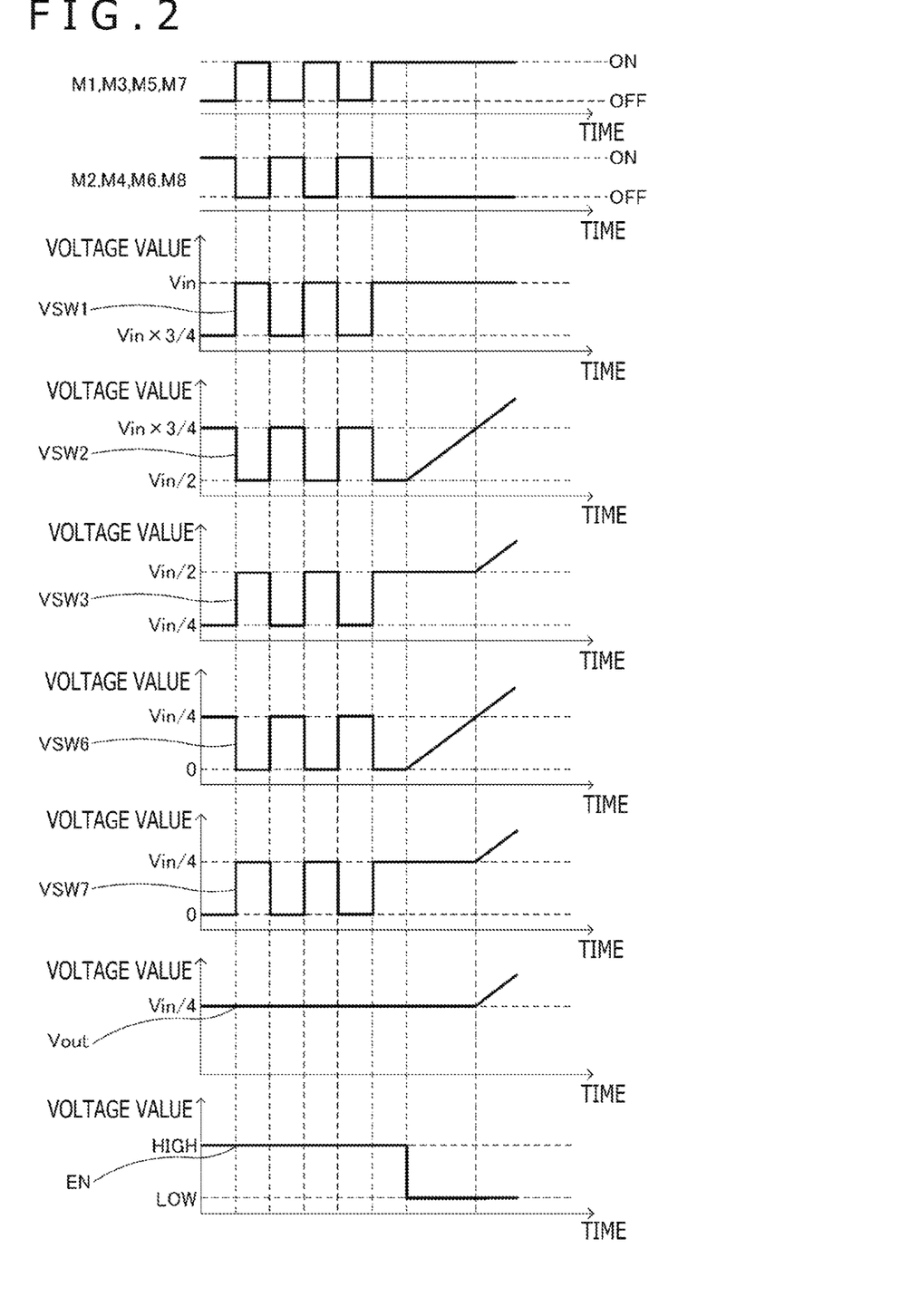
FIG. 2 is a timing diagram illustrating voltages of various parts of the switched capacitor converter illustrated in FIG. 1.

FIG. 1 is a diagram illustrating a comparative example of a switched capacitor converter (typical configuration to be compared with an embodiment to be described later). The topology of a switched capacitor converter SCC1 according to the present comparative example is a Dickson topology. FIG. 2 is a timing diagram illustrating voltages of various parts of the switched capacitor converter SCC1.

The switched capacitor converter SCC1 includes switching elements M1 to M8, capacitors C1 to C3, and a control unit CNT1.

A first terminal of the switching element M1 is connected to a positive electrode of a direct-current voltage source VS1. A negative electrode of the direct-current voltage source VS1 is connected to a ground potential. The direct-current voltage source VS1 supplies an input voltage Vin to the first terminal of the switching element M1.

A second terminal of the switching element M1 is connected to a first terminal of the switching element M2 and a first terminal of the capacitor C3. A second terminal of the switching element M2 is connected to a first terminal of the switching element M3 and a first terminal of the capacitor C2. A second terminal of the switching element M3 is connected to a first terminal of the switching element M4 and a first terminal of the capacitor C1.

A second terminal of the switching element M4 is connected to a first terminal of the switching element M7, a first terminal of a load LD1, and a first terminal of the switching element M6. A second terminal of the switching element M7 is connected to a first terminal of the switching element M8, a second terminal of the capacitor C1, and a second terminal of the capacitor C3. A second terminal of the switching element M6 is connected to a first terminal of the switching element M5 and a second terminal of the capacitor C2. A second terminal of the switching element M8, a second terminal of the load LD1, a second terminal of the switching element M5 are connected to the ground potential.

The control unit CNT1 controls the switching elements M1, M3, M5, and M7 by a first control signal $\Phi 1$, and controls the switching elements M2, M4, M6, and M8 by a second control signal $\Phi 2$.

The control unit CNT1 is supplied with an enable signal EN. When the enable signal EN is at a HIGH level, the control unit CNT1 complementarily performs on/off control of the switching elements M1, M3, M5, and M7 and the switching elements M2, M4, M6, and M8.

A switching voltage VSW1 switches between a value of Vin and a value of Vin × ¾. The switching voltage VSW1 occurs at a connection node between the switching element M1 and the switching element M2.

A switching voltage VSW2 switches between a value of Vin × ¾ and a value of Vin/2. The switching voltage VSW2 occurs at a connection node between the switching element M2 and the switching element M3.

A switching voltage VSW3 switches between a value of Vin/2 and a value of Vin/4. The switching voltage VSW3 occurs at a connection node between the switching element M3 and the switching element M4.

A switching voltage VSW6 switches between a value of Vin/4 and zero (ground potential). The switching voltage VSW6 occurs at a connection node between the switching element M5 and the switching element M6.

A switching voltage VSW7 switches between a value of Vin/4 and zero (ground potential). The switching voltage VSW7 occurs at a connection node between the switching element M7 and the switching element M8.

An output voltage Vout has a value of Vin/4. The output voltage Vout occurs at a connection node between the switching element M4, the switching element M6, and the switching element M7. The output voltage Vout is supplied to the load LD1.

A potential difference across the switching element M1 is maximized to a value of Vin when the switched capacitor converter SCC1 is activated. Hence, an element having a withstand voltage of the value of Vin is used as the switching element M1.

A maximum value of a potential difference across the switching element M2 is a value of Vin/2 (=Vin−Vin/2). A maximum value of a potential difference across the switching element M3 is a value of Vin/2 (=Vin×¾−Vin/4). Hence, an element having a withstand voltage of the value of Vin/2 is used as the switching elements M2 and M3.

A maximum value of a potential difference across the switching element M4 is a value of Vin/4 (=Vin/2−Vin/4). A maximum value of a potential difference across the switching element M5 is a value of Vin/4 (=Vin/4-0). A maximum value of a potential difference across the switching elements M5 to M8 is a value of Vin/4 (=Vin/4-0). Hence, an element having a withstand voltage of the value of Vin/4 is used as the switching elements M4 to M8.

When the enable signal EN is at a LOW level, on the other hand, the control unit CNT1 stops the switching control of the switching elements M1 to M8, and sets the switching elements M1 to M8 to an off state. The switched capacitor converter SCC1 is thus set in a standby state. When the enable signal EN is at the LOW level and leakage currents of the switching elements M1 to M8 are the same, the switching voltage VSW1 maintains the value of Vin, the switching voltages VSW2 and VSW3 maintain the value of Vin/2, the switching voltage VSW7 and the output voltage Vout maintain the value of Vin/4, and the switching voltage VSW6 maintains zero.

In practice, however, there are variations in the leakage currents of the switching elements M1 to M8. FIG. 2 illustrates an example of a case where the leakage currents of the switching elements M1 and M2 are larger than those of the switching elements M3 to M8.

When the enable signal EN is at the LOW level, the switching voltage VSW2 rises due to the leakage currents flowing from the switching elements M1 and M2, and gradually approaches the value of Vin.

When the enable signal EN is at the LOW level, the switching voltage VSW3 changes in the same manner as the output voltage Vout through a body diode of the switching element M4.

When the enable signal EN is at the LOW level, the switching voltage VSW6 changes in the same manner as the switching voltage VSW2 through the capacitor C2.

When the enable signal EN is at the LOW level, the switching voltage VSW7 changes in the same manner as the switching voltage VSW3 through the capacitor C1.

When the enable signal EN is at the LOW level, the output voltage Vout changes in the same manner as the switching voltage VSW6 through a body diode of the switching element M6.

In the example illustrated in FIG. 2, when a period in which the switched capacitor converter SCC1 is in the standby state is lengthened, the potential difference across the switching element M5 exceeds the withstand voltage of the switching element M5 due to an increase in the switching voltage VSW6.

The example illustrated in FIG. 2 is an example of a case where the leakage currents of the switching elements M1 and M2 are larger than those of the switching elements M3 to M8. However, a large number of situations other than that in the example illustrated in FIG. 2 are assumed according to variations in the leakage currents of the switching elements M1 to M8. Hence, with regard also to the switching elements M2 to M4 and M6 to M8, the potential differences across the switching elements M2 to M4 and M6 to M8 may exceed the withstand voltages of the switching elements M2 to M4 and M6 to M8.

In view of the above-described considerations, in the following, a novel embodiment is proposed which can prevent destruction of switching elements.

<Switched Capacitor Converter (Embodiment)>

Figure 3:
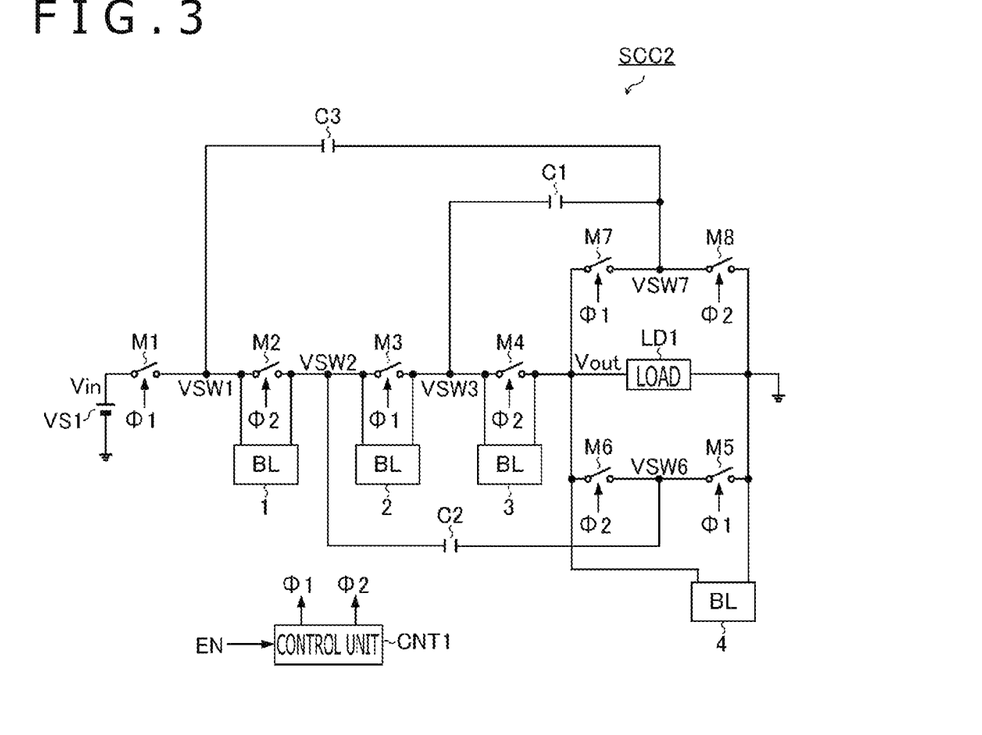
FIG. 3 is a diagram illustrating a switched capacitor converter according to an embodiment.

FIG. 3 is a diagram illustrating a switched capacitor converter according to an embodiment. A switched capacitor converter SCC2 according to the present embodiment is different from the switched capacitor converter SCC1 described above in that the switched capacitor converter SCC2 includes balance circuits 1 to 4. Otherwise, the switched capacitor converter SCC2 is basically similar to the switched capacitor converter SCC1 described above.

The switched capacitor converter SCC2 includes first to fourth switch circuits.

The first switch circuit includes a switching element M2 and a balance circuit 1. The balance circuit 1 inhibits a potential difference across the switching element M2 from exceeding a threshold value. The balance circuit 1 prevents destruction of the switching element M2.

The second switch circuit includes a switching element M3 and a balance circuit 2. The balance circuit 2 inhibits a potential difference across the switching element M3 from exceeding a threshold value. The balance circuit 2 prevents destruction of the switching element M3.

The third switch circuit includes a switching element M4 and a balance circuit 3. The balance circuit 3 inhibits a potential difference across the switching element M4 from exceeding a threshold value. The balance circuit 3 prevents destruction of the switching element M4.

The fourth switch circuit includes switching elements M5 to M8 and a balance circuit 4. The balance circuit 4 inhibits a potential difference across a switch unit from exceeding a threshold value. The switch unit is a parallel circuit of a series circuit of the switching elements M5 and M6 and a series circuit of the switching elements M7 and M8. The balance circuit 4 prevents destruction of the switching elements M5 to M8.

Figure 4:
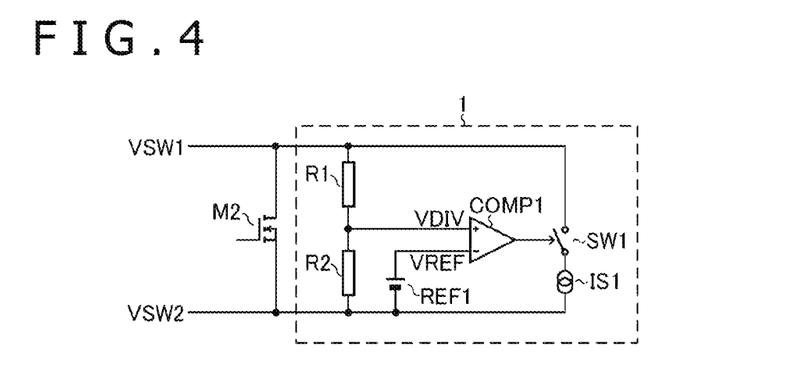
FIG. 4 is a diagram illustrating an example of a configuration of a first switch circuit.

FIG. 4 is a diagram illustrating an example of a configuration of the first switch circuit. In the configuration example illustrated in FIG. 4, the switching element M2 is an N-channel MOS field-effect transistor. In addition, in the configuration example illustrated in FIG. 4, the balance circuit 1 includes resistances R1 and R2, a reference voltage source REF1, a comparator COMP1, a switch SW1, and a current source IS1. The current source IS1 is preferably a constant current source that outputs a constant current.

A switching voltage VSW1 is applied to a drain of the switching element M2. A switching voltage VSW2 is applied to a source of the switching element M2.

The drain of the switching element M2 is connected to a first terminal of the resistance R1 and a first terminal of the switch SW1. A second terminal of the resistance R1 is connected to a first terminal of the resistance R2 and a non-inverting input terminal of the comparator COMP1. A second terminal of the switch SW1 is connected to a first terminal of the current source IS1. A positive electrode of the reference voltage source REF1 is connected to an inverting input terminal of the comparator COMP1. The source of the switching element M2 is connected to a second terminal of the resistance R2, a negative electrode of the reference voltage source REF1, and a second terminal of the current source IS1.

A voltage dividing circuit including the resistances R1 and R2 divides the potential difference across the switching element M2 (VSW1–VSW2).

The comparator COMP1 compares a reference voltage VREF output from the reference voltage source REF1 and a divided voltage VDIV output from the voltage dividing circuit described above, with each other.

The switch SW1 is controlled by the comparator COMP1. When the divided voltage VDIV is higher than the reference voltage VREF, that is, when the output of the comparator COMP1 is at a HIGH level, the switch SW1 is turned on. When the switch SW1 is turned on, a current flows from the drain of the switching element M2 to the source of the switching element M2 via the switch SW1 and the current source IS1, so that the potential difference across the switching element M2 is reduced. The respective resistance values of the resistances R1 and R2 and the value of the reference voltage VREF are set such that the divided voltage VDIV and the reference voltage VREF coincide with each other when the potential difference across the switch unit becomes the threshold value. On the other hand, when the divided voltage VDIV is lower than the reference voltage VREF, that is, when the output of the comparator COMP1 is at a LOW level, the switch SW1 is turned off.

The balance circuits 2 to 4 have a circuit configuration identical to that of the balance circuit 1. Circuit constants of the balance circuit 2 are set according to the withstand voltage of the switching element M3. Circuit constants of the balance circuit 3 are set according to the withstand voltage of the switching element M4. Circuit constants of the balance circuit 4 are set according to the withstand voltage of the switching elements M5 to M8.

The balance circuits 1 to 4 can prevent destruction of the switching elements M2 to M8 at a low cost and in a small area as compared with a plurality of clamp elements that respectively clamp the switching voltages VSW2, VSW3, VSW6, and VSW7 and the output voltage Vout.

Figure 5:
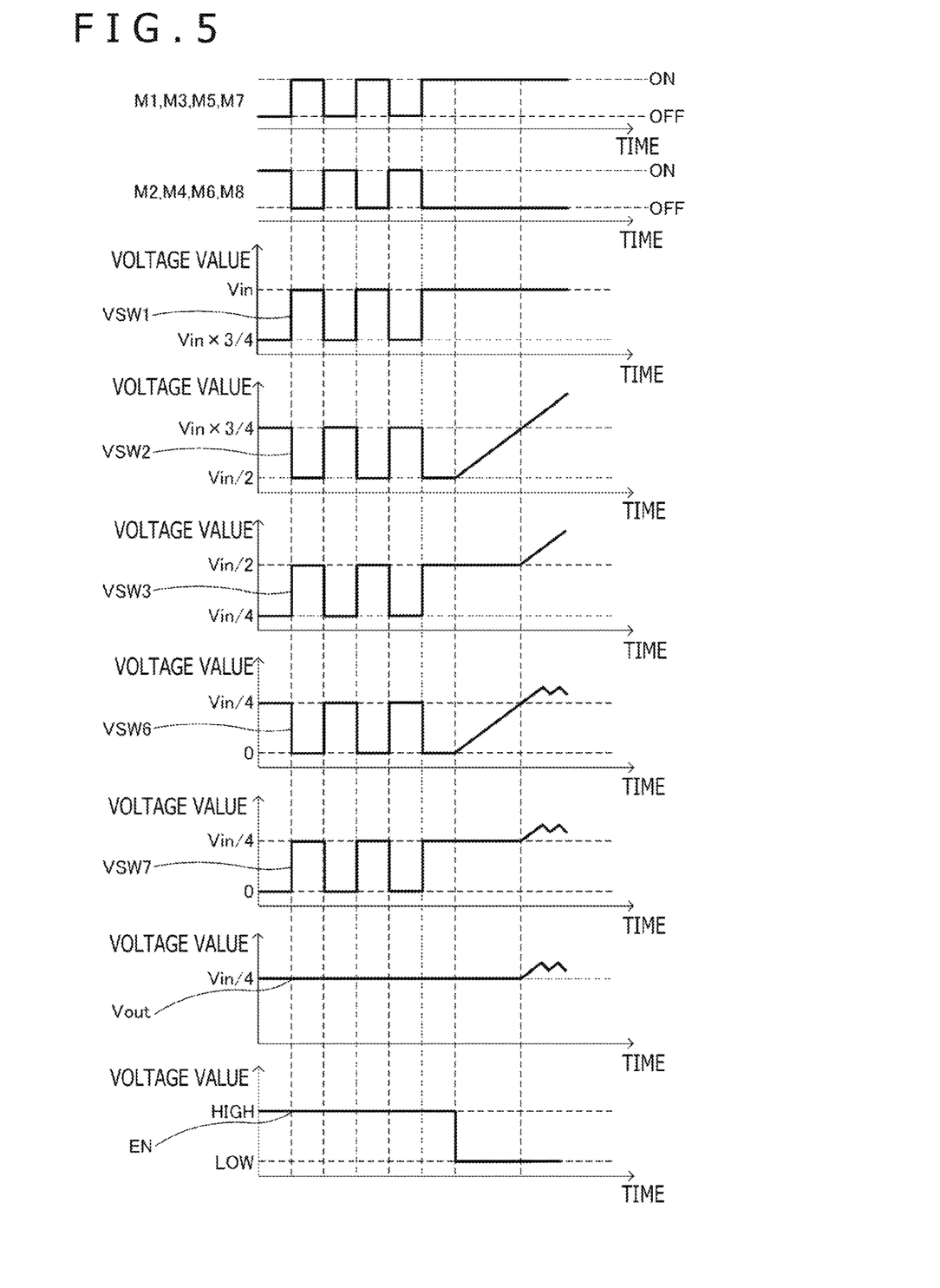
FIG. 5 is a timing diagram illustrating voltages of various parts of the switched capacitor converter illustrated in FIG. 3.

FIG. 5 is a timing diagram illustrating voltages of various parts of the switched capacitor converter SCC2. FIG. 5 illustrates an example of a case where the leakage currents of the switching elements M1 and M2 are larger than those of the switching elements M3 to M8.

In the example illustrated in FIG. 5, the output voltage Vout rises during a standby time of the switched capacitor converter SCC2. When the output voltage Vout then reaches a threshold value, current extraction in the balance circuit 4 is started, and thus, the output voltage Vout is decreased. When the current extraction in the balance circuit 4 is thereafter stopped, the output voltage Vout rises again. After the current extraction in the balance circuit 4 is started, the switching voltages VSW6 and VSW7 change in the same manner as the output voltage Vout.

Although the balance circuits 1 to 4 described above are effective in preventing destruction of the switching elements M2 to M8, current consumption of the balance circuits 1 to 4 is a factor causing decreased efficiency of the switched capacitor converter SCC2. In order to suppress the current consumption of the balance circuits 1 to 4, it suffices to set the balance circuits 1 to 4 to a disabled state during switching operation of the switched capacitor converter SCC2. Further, it suffices to set the balance circuits 1 to 4 to an enabled state during the standby time of the switched capacitor converter SCC2.

However, because the balance circuits 1 to 3 are not circuits provided with a ground potential reference, a level shifter may be necessary when a function of enabling the balance circuits 1 to 3 is implemented. The level shifter has a possibility of erroneous operation, and has a large circuit area. A circuit configuration that obviates a need for the level shifter is hence desired.

Figure 6:
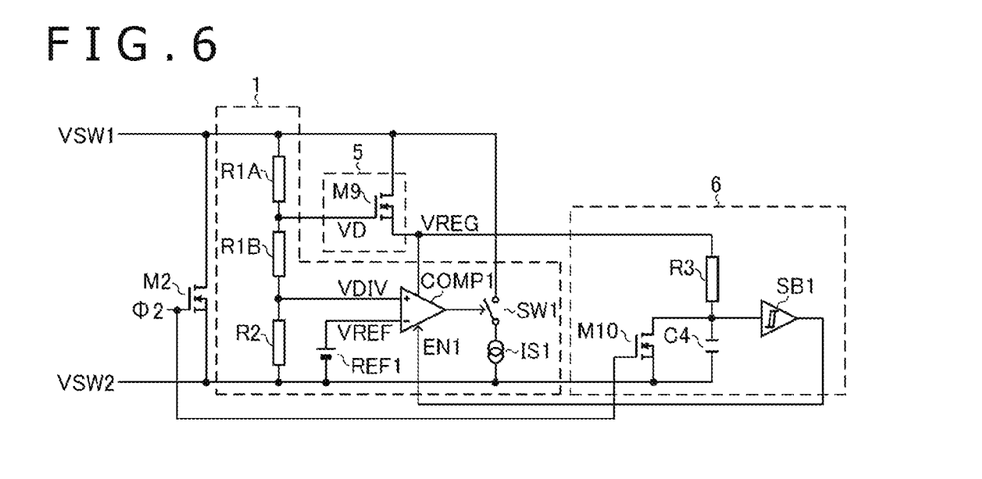
FIG. 6 is a diagram illustrating another example of the configuration of the first switch circuit.

FIG. 6 is a diagram illustrating another example of the configuration of the first switch circuit. The first switch circuit illustrated in FIG. 6 has a circuit configuration that obviates a need for the level shifter.

The first switch circuit illustrated in FIG. 6 includes a power supply voltage generating circuit 5 and an enable signal generating circuit 6 in addition to the switching element M2 and the balance circuit 1.

A series circuit of resistances R1A and R1B in the balance circuit 1 illustrated in FIG. 6 is equivalent to the resistance R1 in the balance circuit 1 illustrated in FIG. 4.

The power supply voltage generating circuit 5 includes a switch M9. The switch M9 is controlled by a divided voltage VD (>Divided Voltage VDIV) output from a voltage dividing circuit including the resistances R1A, R1B, and R2. In the configuration example illustrated in FIG. 6, the switch M9 is an N-channel MOS field-effect transistor, and the power supply voltage generating circuit 5 is a source follower circuit. A voltage VREG output from the power supply voltage generating circuit 5 is used as a power supply voltage of the comparator COMP1. The withstand voltage of the comparator COMP1 can thus be reduced to the voltage output from the switch M9.

The enable signal generating circuit 6 generates an enable signal EN1 by using a second control signal Φ2 for controlling the switching element M2. The enable signal generating circuit 6 includes a resistance R3, a capacitor C4, a switch M10 as an N-channel MOS field-effect transistor, and a Schmitt buffer SB1.

The power supply voltage VREG is applied to a first terminal of the resistance R3. A second terminal of the resistance R3 is connected to a first terminal (drain) of the switch M10, a first terminal of the capacitor C4, and an input terminal of the Schmitt buffer SB1. A switching voltage VSW2 is applied to a second terminal (source) of the switch M10 and a second terminal of the capacitor C4. The enable signal EN1 is output from an output terminal of the Schmitt buffer SB1.

While the switched capacitor converter SCC2 is performing switching operation, the switch M10 is repeatedly turned on and off, and thus, the capacitor C4 is repeatedly charged and discharged. The enable signal EN1 output from the Schmitt buffer SB1 hence maintains a LOW level. When the enable signal EN1 is at the LOW level, the comparator COMP1 or, in turn, the balance circuit 1, is disabled. The current consumption of the balance circuit 1 can thus be suppressed.

During the standby time of the switched capacitor converter SCC2, on the other hand, the switch M10 remains off, and thus, the discharging of the capacitor C4 is stopped. The enable signal EN1 output from the Schmitt buffer SB1 is hence at a HIGH level. When the enable signal EN1 is at the HIGH level, the comparator COMP1 or, in turn, the balance circuit 1, is enabled.

Examples of Application

Figure 7:
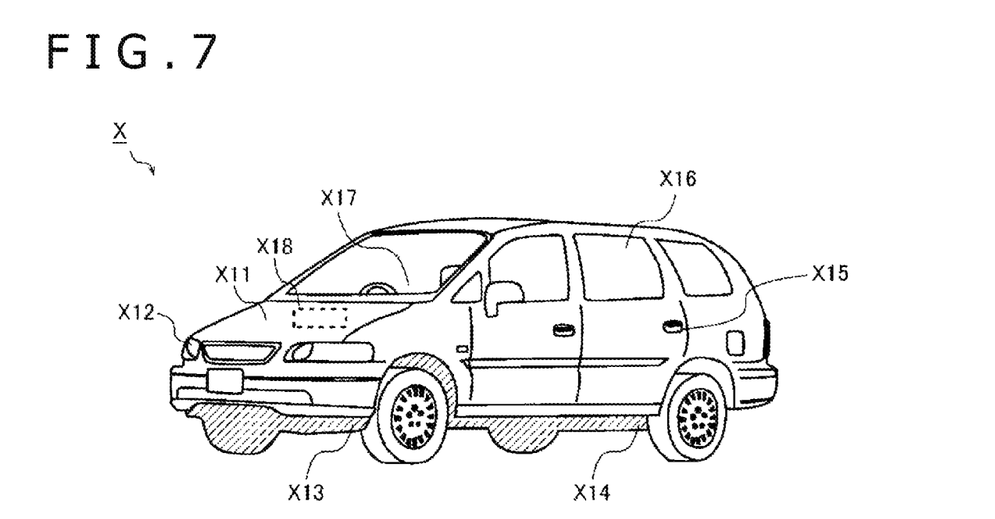
FIG. 7 is an external view of a vehicle.
Figure 8:
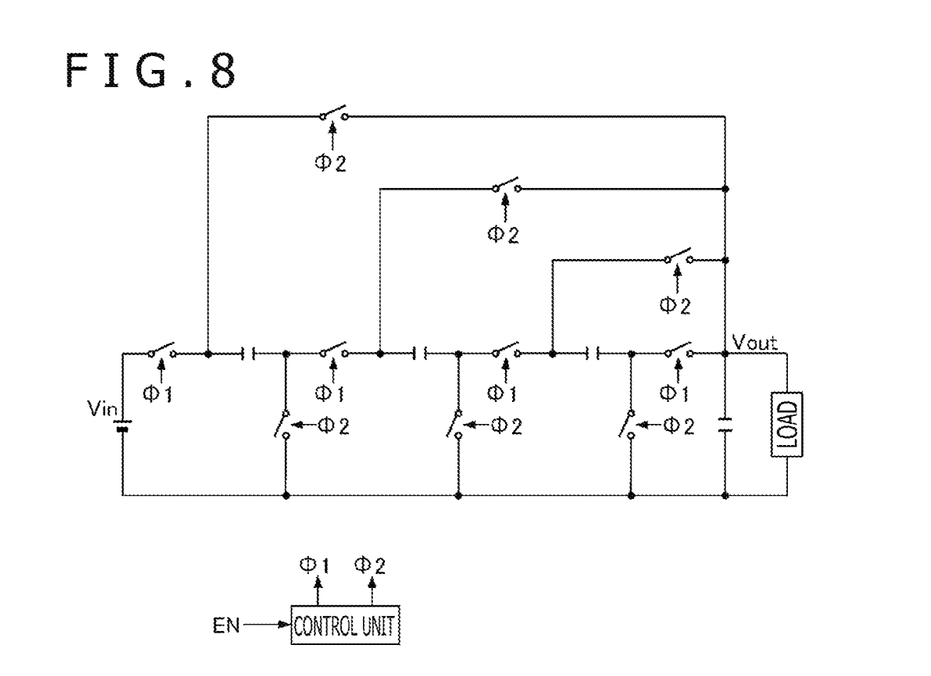
FIG. 8 is a diagram illustrating a first example of a switched capacitor converter having a topology different from a Dickson topology.
Figure 9:
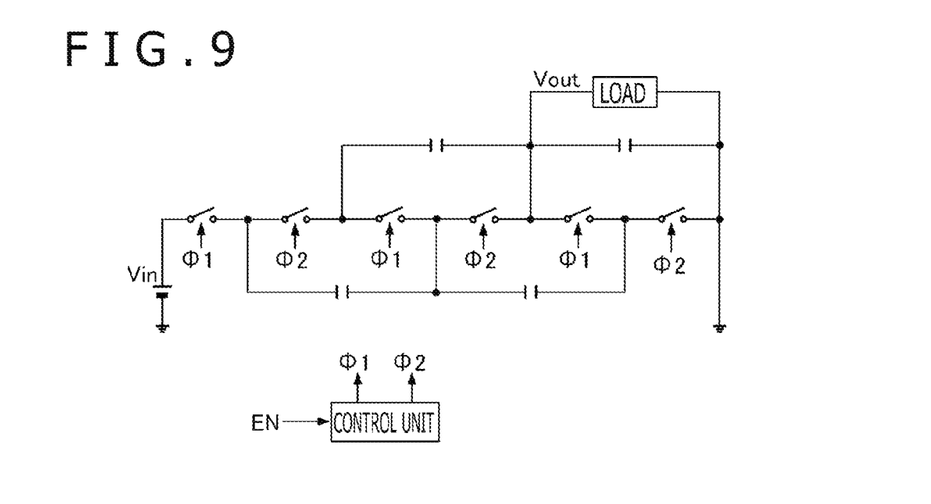
FIG. 9 is a diagram illustrating a second example of a switched capacitor converter having a topology different from the Dickson topology.
Figure 10:
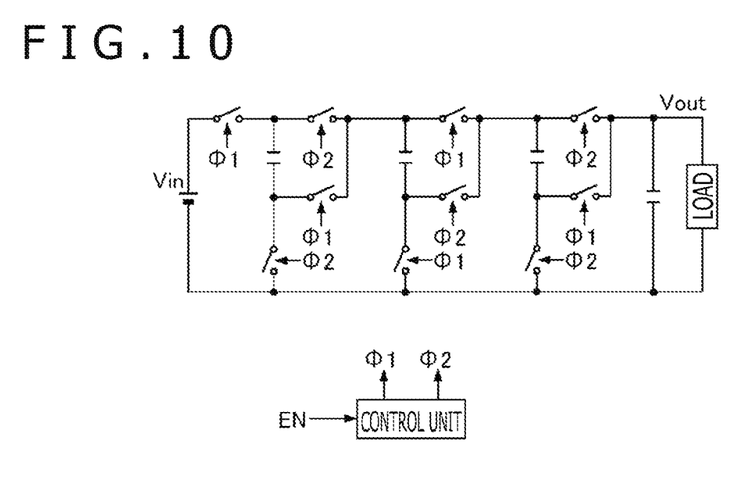
FIG. 10 is a diagram illustrating a third example of a switched capacitor converter having a topology different from the Dickson topology.
Figure 11:
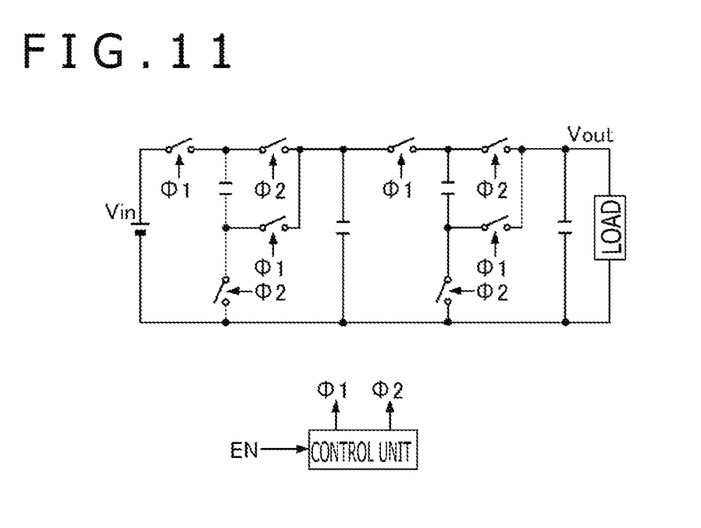
FIG. 11 is a diagram illustrating a fourth example of a switched capacitor converter having a topology different from the Dickson topology.

FIG. 7 is an external view of a vehicle X. The vehicle X in the present configuration example is mounted with various electronic apparatuses X11 to X18 that operate by being supplied with a voltage output from an unillustrated battery. It is to be noted that mounting positions of the electronic apparatuses X11 to X18 in the present figure may be different from actual mounting positions for the convenience of illustration.

The electronic apparatus X11 represents an engine control unit that performs control related to an engine (injection control, electronic throttle control, idling control, oxygen sensor heater control, auto-cruise control, and other control).

The electronic apparatus X12 represents a lamp control unit that performs on/off control on a high intensity discharged lamp [HID], a daytime running lamp [DRL], and other lamps.

The electronic apparatus X13 represents a transmission control unit that performs control related to a transmission.

The electronic apparatus X14 represents a braking unit that performs control related to motion of the vehicle X (anti-lock brake system [ABS] control, electric power steering [EPS] control, electronic suspension control, and other control).

The electronic apparatus X15 represents a security control unit that performs driving control on door locks, a crime prevention alarm, and other components.

The electronic apparatus X16 represents electronic apparatuses incorporated in the vehicle X in a stage of factory shipment as standard equipment items or manufacturer option items, such as windshield wipers, electrically operated door mirrors, power windows, dampers (shock absorbers), an electrically operated sunroof, and electrically operated seats.

The electronic apparatus X17 represents electronic apparatuses optionally mounted in the vehicle X as user option items such as a vehicle-mounted audio/visual [A/V] apparatus, a car navigation system, and an electronic toll collection system [ETC].

The electronic apparatus X18 represents electronic apparatuses provided with a high withstand voltage motor, such as a vehicle-mounted blower, an oil pump, a water pump, and a battery cooling fan.

It is to be noted that the switched capacitor converter SCC2 described earlier can be incorporated in any of the electronic apparatuses X11 to X18. In addition, applications of the switched capacitor converter SCC2 described earlier are not limited to a power supply mounted in the vehicle X, and may be a power supply mounted in an industrial apparatus, for example.

OTHERS

In addition to the foregoing embodiment, various changes can be made to the configuration of the disclosure without departing from the spirit of the disclosure. It is to be recognized that the foregoing embodiment is illustrative in all respects, and is not restrictive. It is to be understood that the technical scope of the present disclosure is represented by claims rather than the description of the foregoing embodiment, and includes all changes belonging to meanings and a scope equivalent to the claims.

For example, in the switched capacitor converter SCC2, the dispositions of the direct-current voltage source VS1 and the load LD1 may be interchanged. In a case where the dispositions of the direct-current voltage source VS1 and the load LD1 are interchanged, the voltage supplied from the switched capacitor converter SCC2 to the load LD1 (output voltage of the switched capacitor converter SCC2) is higher than the voltage supplied from the direct-current voltage source VS1 to the switched capacitor converter SCC2 (input voltage of the switched capacitor converter SCC2).

The switch circuits (first to fourth switch circuits) described above can be applied also to switched capacitor converters having topologies different from the Dickson topology. The switched capacitor converters having topologies different from the Dickson topology include, for example, switched capacitor converters illustrated in FIGS. 8 to 11.

The switch circuit described above has a configuration (first configuration) including a switch unit including at least one switching element (M2), and a balance circuit (1) provided for the switch unit, the balance circuit being configured to inhibit a potential difference across the switch unit from exceeding a threshold value.

The switch circuit having the above-described first configuration can prevent destruction of the switching element.

In the switch circuit having the above-described first configuration, there may be adopted a configuration (second configuration) in which the balance circuit includes a voltage dividing circuit (R1, R2) configured to divide the potential difference across the switch unit, a comparator (COMP1) configured to compare a reference voltage and a first divided voltage output from the voltage dividing circuit with each other, a first switch (SW1) configured to be controlled by the comparator, and a current source (IS1), and a direct-current circuit of the first switch and the current source is connected in parallel with the switch unit.

The switch circuit having the above-described second configuration can implement a balance circuit at a low cost and in a small area as compared with clamp elements.

In the switch circuit having the above-described second configuration, there may be adopted a configuration (third configuration) in which the switch circuit includes a second switch (M9) configured to be controlled by a second divided voltage output from the voltage dividing circuit, the second divided voltage is higher than the first divided voltage, and a voltage output from the second switch is used as a power supply voltage of the comparator.

The switch circuit having the above-described third configuration can reduce the withstand voltage of the comparator to the voltage output from the second switch.

In the switch circuit having one of the above-described first to third configurations, there may be adopted a configuration (fourth configuration) in which the switch circuit includes an enable signal generating circuit (6) configured to generate an enable signal by using a control signal for controlling the switch unit, and switching between enabling and disabling of the balance circuit is performed according to the enable signal.

The switch circuit having the above-described fourth configuration can achieve a reduction in the current consumption of the balance circuit with no level shifter being provided.

In the switch circuit having the above-described fourth configuration, there may be adopted a configuration (fifth configuration) in which the enable signal generating circuit includes a charge storage unit (C4), and discharging of the charge storage unit is stopped by stopping switching of the switch unit.

The switch circuit having the above-described fifth configuration can simplify the circuit configuration of the enable signal generating circuit.

The switched capacitor converter (SCC2) described above has a configuration (sixth configuration) including at least one switch circuit having one of the above-described first to fifth configurations, and at least one capacitor (C1 to C3).

The switched capacitor converter having the above-described sixth configuration can prevent destruction of the switching element.

In the switched capacitor converter having the above-described sixth configuration, there may be adopted a configuration (seventh configuration) in which the switched capacitor converter includes a plurality of the switch circuits, a plurality of the balance circuits have an identical circuit configuration, and, in each of the plurality of the switch circuits, circuit constants of the balance circuit are set according to a withstand voltage of the at least one switching element.

The plurality of balance circuits in the switched capacitor converter having the above-described seventh configuration have an identical circuit configuration. It is thus possible to simplify the circuit configuration of the switched capacitor converter as a whole.

The vehicle (X) described above has a configuration (eighth configuration) including the switched capacitor converter having the above-described sixth or seventh configuration.

The vehicle having the above-described eighth configuration can prevent destruction of the switching element.

According to the disclosure described in the present specification, it is possible to prevent destruction of a switching element.

What is claimed is:

1. A switch circuit, comprising:
a switch unit including at least one switching element;
a balance circuit provided for the switch unit, the balance circuit being configured to inhibit a potential difference across the switch unit from exceeding a threshold value, wherein
the balance circuit includes:
a first switch;
a current source connected in series with the first switch;
a voltage dividing circuit configured to divide the potential difference across the switch unit to output a first divided voltage; and
a comparator configured to:
compare a reference voltage with the first divided voltage; and
control the first switch based on the comparison, and
a direct-current circuit of the first switch and the current source is connected in parallel with the switch unit; and
a second switch, wherein
the voltage dividing circuit is further configured to output a second divided voltage,
the second switch is configured to be controlled by the second divided voltage,
the second divided voltage is higher than the first divided voltage,
the second switch is configured to output a voltage, and
the voltage output from the second switch is used as a power supply voltage of the comparator.

2. A switched capacitor converter, comprising:
the switch circuit according to claim 1; and
at least one capacitor.

3. The switched capacitor converter according to claim 2, further comprising a plurality of switch circuits, wherein
the plurality of switch circuits includes the switch circuit,
each switch circuit of the plurality of switch circuits includes the switch unit and the balance circuit,
the balance circuit of each switch circuit of the plurality of switch circuits has an identical circuit configuration, and
in each switch circuit of the plurality of switch circuits, circuit constants of the balance circuit are set according to a withstand voltage of the at least one switching element.

4. A vehicle, comprising:
the switched capacitor converter according to claim 2.

5. A switch circuit-according to claim 1, comprising:
a switch unit including at least one switching element;
a balance circuit provided for the switch unit, the balance circuit being configured to inhibit a potential difference across the switch unit from exceeding a threshold value, wherein
the balance circuit includes:
a first switch; and
a current source connected in series with the first switch, and
a direct-current circuit of the first switch and the current source is connected in parallel with the switch unit; and
an enable signal generating circuit configured to generate an enable signal by using a control signal, wherein
the control signal is for control of the switch unit, and
the balance circuit is further configured to switch between an enabled state and a disabled state based on the enable signal.

6. The switch circuit according to claim 5, wherein
the enable signal generating circuit includes a charge storage unit, and
discharging of the charge storage unit stops when switching of the switch unit stops.

7. A switched capacitor converter, comprising:
the switch circuit according to claim 5; and
at least one capacitor.

8. The switched capacitor converter according to claim 7, further comprising a plurality of switch circuits, wherein
the plurality of switch circuits includes the switch circuit,
each switch circuit of the plurality of switch circuits includes the switch unit and the balance circuit, the balance circuit of each switch circuit of the plurality of switch circuits has an identical circuit configuration, and in each switch circuit of the plurality of switch circuits, circuit constants of the balance circuit are set according to a withstand voltage of the at least one switching element.

9. A vehicle, comprising:
the switched capacitor converter according to claim 7.

* * * * *